(12) United States Patent
Miura et al.

(10) Patent No.: US 7,737,464 B2
(45) Date of Patent: Jun. 15, 2010

(54) ORGANIC LIGHT EMITTING APPARATUS

(75) Inventors: Seishi Miura, Sagamihara (JP);
Naoyuki Ito, Yokohama (JP); Yojiro Matsuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 65 days.

(21) Appl. No.: 11/933,808

(22) Filed: Nov. 1, 2007

(65) Prior Publication Data
US 2008/0111122 A1    May 15, 2008

(30) Foreign Application Priority Data
Nov. 10, 2006  (JP) ............... 2006-304791
Oct. 19, 2007  (JP) ............... 2007-272013

(51) Int. Cl.
*H01J 63/04* (2006.01)
(52) U.S. Cl. .............. 257/103; 257/E33.064; 313/506
(58) Field of Classification Search ............ 257/4, 257/103, E33.064; 313/500, 506
See application file for complete search history.

(56) References Cited

U.S. PATENT DOCUMENTS

| | | | |
|---|---|---|---|
| 6,589,673 B1 | 7/2003 | Kido et al. | 428/690 |
| 2003/0072967 A1* | 4/2003 | Kido et al. | 428/690 |
| 2004/0032202 A1* | 2/2004 | Fukunaga | 313/495 |
| 2005/0248272 A1* | 11/2005 | Koike et al. | 313/512 |
| 2005/0285508 A1* | 12/2005 | Murayama et al. | 313/503 |
| 2006/0033425 A1* | 2/2006 | Miura et al. | 313/504 |

* cited by examiner

*Primary Examiner*—Minh-Loan T Tran
(74) *Attorney, Agent, or Firm*—Fitzpatrick, Cella, Harper & Scinto

(57) ABSTRACT

An organic light emitting apparatus comprising a substrate and a plurality of organic light emitting devices having different emission colors to each other formed on the substrate, each of the plurality of organic light emitting devices including a cathode, an electron injection layer which is in contact with the cathode, organic compound layers including a light emitting layer, and an optically-transparent anode, the electron injection layer including an organic compound and at least one of an alkali metal, an alkaline earth metal, an alkali metal compound, and an alkaline earth metal compound. The electron injection layer has a thickness adjusted for each of the different emission colors so that each of the plurality of organic light emitting devices having the different emission colors enhances light emitted from the light emitting layer.

9 Claims, 4 Drawing Sheets

ORGANIC LIGHT EMITTING APPARATUS

BACKGROUND OF THE INVENTION

1. Field of the Invention

The present invention relates to a top-emission type organic light emitting apparatus that includes a plurality of organic light emitting devices (organic EL devices) with two or more emission colors.

2. Description of the Related Art

In recent years, attentions have been paid to self-emitting devices for flat panels. The self-emitting devices include plasma-emission display devices, field emission devices, and electroluminescence (EL) devices.

Of those, in particular, the organic light emitting devices have been energetically studied and developed. An area-color type organic light emitting apparatus, such as one with a single color of green or that with further added blue, red, or any of other colors, has been commercialized. Currently, development of a full-color type has been actively conducted.

The organic compound layer of the organic light emitting apparatus, through which emitted light passes, has a thickness almost the same as or less than the emission wavelength. Thus, for obtaining a device having a desired emission color and a good luminous efficiency, it is known that a design in consideration of the influence of optical interference is required.

Japanese Patent Application Laid-Open No. 2000-323277 discloses a technology for improving the luminous efficiency of an organic electroluminescent multicolor display that includes an array arrangement of organic EL devices with different emission colors. In other words, the luminous efficiency of the organic electroluminescent multicolor display is enhanced by providing some functional layers (such as a hole transport layer and an electron transport layer) having the same functions of organic compound material layers except a light emitting layer with different thicknesses corresponding to an emission color.

The general structure of the organic light emitting device includes organic compound layers and an upper reflection electrode with a low work function, which are sequentially formed on a glass substrate. The organic compound layers include a transparent anode made of ITO, a hole transport layer, a light emitting layer, and an electron transport layer. Such device structure described above is generally referred to as of a bottom-emission type; the emitted light is discharged from the rear side of the substrate after transmitting through the anode having optical transparency.

An organic light emitting apparatus having a two-dimensional array of such bottom-emission type organic light emitting devices may be driven by an active matrix system. In this case, however, there is a disadvantage in that the bottom-emission type device has a small opening ratio because of the presence of a thin film transistor (TFT) and wiring on a substrate. For improving such disadvantage described above, a so-called top-emission type organic light emitting device has been proposed. The device is able to discharge emitted light in the laminating direction of organic layers.

In each of Japanese Patent Application Laid-Open No. 2005-276542 and Japanese Patent Application Laid-Open No. 2004-014360, a technology for use of TFT to drive a top-emission type organic light emitting device has been disclosed. In this case, a lower reflection electrode is driven as a cathode, and an upper transparent electrode is driven as an anode. In Japanese Patent Application Laid-Open No. 2005-276542, a technology for use of amorphous TFT to drive the device has been further disclosed.

The top-emission type organic light emitting device requires formation of an optically-transparent electrode (i.e., a transparent or translucent electrode) on an uppermost layer of the organic compound layers on a side opposite to the substrate. For instance, an ITO film is formed on the organic compound layer by sputtering. The organic compound layers in such a case have been known to be damaged by oxidation or the like, which leads to an increase in a drive voltage of the device. For preventing the device from being damaged by such a sputtering process, for example, the formation of an ITO film is carried out by a coating process in Japanese Patent Application Laid-Open No. 2004-014360. In contrast, in Japanese Patent Application Laid-Open No. 2005-276542, a buffer layer is formed on the organic compound layers to eliminate an increase in voltage due to the formation of an ITO film by sputtering.

In any of Japanese Patent Applications Laid-Open Nos. 2004-14360, H10-270171, and H10-270172, an electron transport material and one of an alkali metal, an alkali salt, and an alkali oxide are employed for an electron injection layer to reduce a drive voltage. Japanese Patent Application Laid-Open No. 2005-183265 discloses a technology that enables an electron injection from various kinds of metal electrodes. Such a technology employs a layer made of a mixture of cesium carbonate and an electron transport material, which can be easily handled, as an electron injection layer.

An optical interference should be considered for improving the luminous efficiency of an organic light emitting device. In general, the maximum luminous efficiency can be obtained under the conditions in which the distance between the reflection surface and the emission surface is an uneven multiple of $\lambda/4$ with respect to the emission wavelength $\lambda$. In other words, the distance between the reflection surface and the emission surface needs to be changed depending on emission wavelength. However, when the thickness of the organic light emitting device is adjusted with typical charge transport materials, the drive voltage may differ according to emission colors due to high resistivity of the charge transport material. Thus, there is a problem in that the organic light emitting device is hard to drive under such conditions. In this case, a driving circuit, wiring, and the like should also be changed depending on emission color. In particular, in the case where the organic light emitting device is driven using a thin film transistor (TFT), it becomes difficult to satisfy the same drive characteristics for every emission color when the drive voltage differs largely. In particular, when the distance between the reflection surface and the emission surface is set to $3\lambda/4$ or more, it is found that the above problem appears markedly due to an increase in thickness of a charge transport layer and an increase in difference between the drive voltages.

SUMMARY OF THE INVENTION

The present invention has been made in view of the above-mentioned problems, and intends to provide an organic light emitting apparatus having a small drive voltage and a small difference between drive voltages for the emission colors.

In order to solve the problems described in the related art, an organic light emitting apparatus according to a first aspect of the present invention includes: a substrate; and a plurality of organic light emitting devices having different emission colors to each other formed on the substrate, where each of the plurality of organic light emitting devices includes a cathode, an electron injection layer which is in contact with the cathode, organic compound layers including a light emitting layer, and an optically-transparent anode, in which the electron injection layer includes an organic compound and at least one of an alkali metal, an alkaline earth metal, an alkali metal compound, and an alkaline earth metal compound, and has a thickness adjusted for each of the different emission colors so that each of the plurality of organic light emitting devices having the different emission colors enhances light emitted from the light emitting layer.

According to the present invention, there can be provided an organic light emitting apparatus having a small drive voltage and a small difference between drive voltages of the emission colors. Because the thickness of an electron injection layer, which requires a small increase in drive voltage when increasing the thickness thereof, is adjusted for every color.

Further features of the present invention will become apparent from the following description of exemplary embodiments with reference to the attached drawings.

DESCRIPTION OF THE EMBODIMENTS

An organic light emitting apparatus according to the present invention includes a substrate and a plurality of organic light emitting devices formed on the substrate. The organic light emitting devices have different emission colors to each other. In addition, each organic light emitting device includes a cathode, an electron injection layer which is in contact with the cathode, an organic compound layer containing a light emitting layer, and an optically-transparent anode. These structural components are successively formed on the substrate in the stated order. The electron injection layer includes an organic compound and at least one of an alkali metal, an alkaline earth metal, an alkali metal compound, and an alkaline earth metal compound. The inclusion of these materials can lead to an increase in electron-injection ability.

In the present invention, further, the thicknesses of the electron injection layers are adjusted for the respective emission colors so that each of the plurality of organic light emitting devices having different emission colors can enhance light emitted from a light emitting layer. The electron injection layer has an electric resistance smaller than that of any other organic compound layers. Thus, the thickness of the electron injection layer can be adjusted to suppress an increase in drive voltage and enhance light from the light emitting layer. Further, because the increase of the drive voltage is small, the differences between the drive voltages for each of the emission colors can be reduced.

Hereinafter, specific embodiments of the organic light emitting apparatus of the present invention will be described. However, the present invention is not limited to any of these embodiments.

Figure 1:
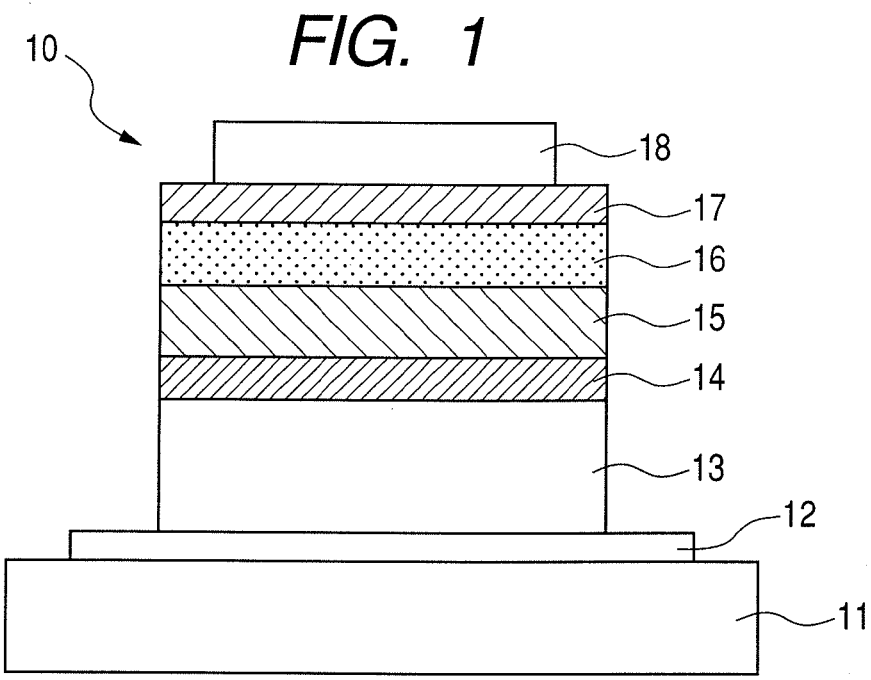
FIG. 1 is a schematic diagram that illustrates a configuration of an organic light emitting device of the present invention.

Referring to FIG. 1, an organic light emitting device 10 includes an optically-reflective cathode 12 formed on a substrate 11 and organic compound layers formed on the optically-reflective cathode 12. Here, the organic compound layers are an electron injection layer 13, an electron transport 14, a light emitting layer 15, a hole transport layer 16, and a hole injection layer 17. Further, an optically-transparent anode 18 is formed on the organic compound layers.

The organic light emitting apparatus of the present invention includes a plurality of such organic light emitting devices. In other words, it is a so-called top-emission type organic light emitting apparatus capable of emitting light with two or more emission colors.

In particular, in the organic light emitting apparatus of the present invention, the electron injection layer 13 contains an electron transport material which is an organic compound, as a host material. In addition, the electron injection layer 13 contains at least one dopant doped in the host material. The dopant may be selected from alkali metals, alkali earth metals, alkali metal compounds, and alkaline earth metal compounds.

The electron transport materials, which can be used as the host material, include an aluminum quinolinol derivative, an oxadiazole derivative, a triazole derivative, a phenyl quinoxaline derivative, and a silole derivative, but not limited thereto.

The alkali metals include Li, Na, K, and Cs. The alkali earth metals include Ca, Sr, and Ba. Of those, cesium and cesium compounds can be particularly favorably used for the dopant. Cs has a small electronegativity, compared with other alkali metals, such as Li and Na. Thus, Cs can favorably be used in terms of diffusion prevention because of the large effectiveness in an increase in electron-injection ability and the large atomic mass compared with other alkali metals. Further, the host material can be doped with a substance obtained by thermal deposition of cesium carbonate. In general, cesium carbonate is stable in the atmospheric air and can be easily handled.

The electron injection layer 13 constructed as described above has an extremely small resistance value compared with that of any of other organic compound layers. Thus, the electron injection layer 13 can be made thicker. On the other hand, the thickness of the other organic compound layers can be determined without considering interference. Thus, they may have the same thickness without depending on an emission color. Among other organic compound layers than the electron injection layer, light emitting layers, which are organic compound layers but not the light emitting layer 15, may be prepared using different materials for each of the emission colors. Thus, each of these layers should be independently formed for every emission color. Among the other organic compounds layers, charge conduction layers (the electron transport layer, the hole transport layer, and the hole injection layer) can be commonly formed to cross over the plurality of organic light emitting devices for different emission colors. In this case, a film-formation process can be simplified and also cost reduction and shortening of a tact time can be achieved. Likewise, the light emitting layer may be commonly formed to cross over the plurality of organic light emitting devices for different emission colors when the same material is used without depending on the emission color, for example, when the generation of different emission colors is achieved by color filters or the like using a white light emitting layer.

Further, in the top-emission device, it is known that the optical path between the reflection electrode and the air interface will also affect optical extraction efficiency. To enhance the optical extraction efficiency, the film thickness of a light emitting layer to be independently formed for every emission color may be changed for every emission color. In this case, the thickness of the light emitting layer may be adjusted without causing a substantial change in drive voltage for every emission color.

The thickness of the above electron injection layer 13 is favorably set close to the maximum efficiency of the organic light emitting device.

Figure 2:
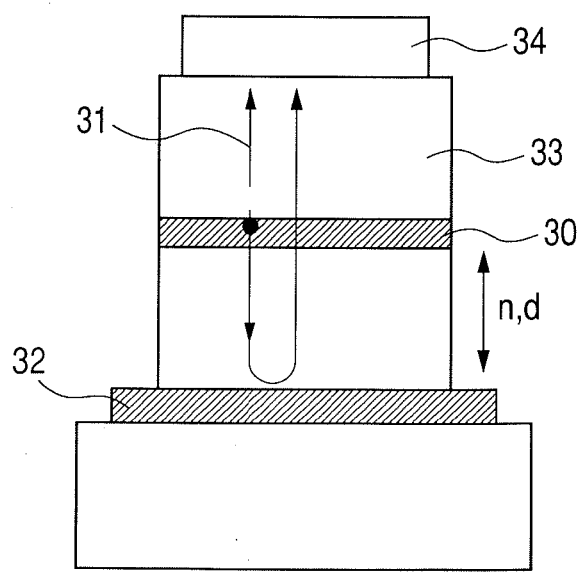
FIG. 2 is a diagram that illustrates an optical interference occurred in the organic light emitting device of the present invention.

In other words, referring to FIG. 2, light emitted from a light emitting region (light emitting position) 30 is extracted outside through a transparent electrode 34 as a result of an interference between a direct light component 31 and a reflection light component 33. The direct light component 31 directly goes out. In contrast, the reflection light component 33 reflects on the reflection surface of a reflection electrode 32 and then goes out. In the embodiment illustrated in FIG. 2, the reflection surface corresponds to the interface between the reflection electrode 32 and the organic compound layers. Here, the optical conditions for reinforcement between the direct light component 31 and the reflection light component 33 can be provided by the following equation (1):

$$nd=(1/4)\lambda \times (2m-1) \quad (m \text{ is an integer of 1 or more}) \quad (1)$$

where $\lambda$ represents the wavelength of light emission, d represents the distance between the reflection electrode 32 and the light emitting region 30, and n represents the reflective index therebetween.

In other words, the optical path from the light emission position of the organic light emitting device for each color to the reflection surface of the reflection electrode is an uneven multiple of $\lambda/4$ with respect to the peak wavelength $\lambda$ of the emitted light. Then, the direct light component and the reflection light component are mutually reinforced by the interference, thereby causing an increase in light-extraction efficiency.

Thus, in the organic light emitting apparatus of the present invention, the thickness of the electron injection layer 13 is determined to have the value d, which is derived from the above equation (1).

Therefore, the organic light emitting apparatus configured as described above shows a low drive voltage and a high efficiency.

Further, the above interference conditions do not always correspond to the above equation (1) because of an influence of a phase shift on the surface of the reflection electrode. Thus, the above interference conditions should be optimized depending on the type of the reflection electrode to be used. Further, in consideration of the display quality, the optimal d value can be used in terms of obtaining light emission with higher color purity.

Further, the organic compound layer can be made thicker when the value d is employed so as to satisfy the optical conditions defined by the above equation (1) with m=2, i.e., $3\lambda/4$. Thus, short-circuit/leak, which causes poor light emission, can be prevented.

Further structural members may be the same as those used in the conventional organic light emitting apparatus.

Examples of the substrate 11 include: various glass substrates; glass substrates on which a plurality of drive circuits, such as thin film transistors (TFTs), are formed with semiconductor layers of poly-Si, a-Si (amorphous silicon), and the like; and silicon wafers on which drive circuits are formed. In particular, in the present invention, the cathode is provided on a side of the substrate. Thus, a poly-Si which is comparatively cheaper than single crystalline silicon as well as poly-Si having only n-channels can be used. In this case, the cost can be lowered, compared with a p-channel type substrate or one using both channels.

Further, when the driving of each organic light emitting device is controlled using TFT, the current supplied to the organic light emitting device passes through the TFT. In general, the TFTs used are those having the same configuration, irrespective of emission colors of the organic light emitting devices. If the drive voltages of the organic light emitting devices are different, a disadvantage may occur that the TFTs have different drive characteristics depending on emission colors. In the present invention, the differences between the drive voltages of the respective emission colors can be reduced. Thus, the drive characteristics can be uniformed without depending on emission colors even when the same TFT is used, thereby obtaining an organic light emitting apparatus capable of representing a desired color more accurately.

The cathode 12 can be made of a material having a high reflectance. Examples of such a material include Cr, Pt, Ag, Au, and Al and alloys including these metal materials. In addition, a transparent conductive material in a thin film may be applied on the high-reflectance metal material. In general, the cathode material is favorably one having a small work function. In particular, however, the electron injection layer 13 used in the present invention shows good ability of electron injection without depending on the work function of the electrode, so a wide variety of metals can be used.

The electron transport layer 14 may be made of any of materials including aluminum quinolinol derivatives, oxadiazole derivatives, triazole derivatives, phenyl quinoxaline derivatives, and silole derivatives, but not limited to these materials.

The light emitting layer 15 may be one prepared using a single material capable of attaining a desired light emission or one prepared by doping a guest material into a host material. For obtaining the latter, both the host material and the guest material are simultaneously vacuum-deposited and the deposition rates of the respective materials are then adjusted, thereby obtaining a light emitting layer having a desired dope concentration. The material of the light emitting layer or the host/guest combination constituting the light emitting layer may be varied, and thus a desired emission color can be obtained for each of the organic light emitting devices.

Examples of the hole transport layer 16 include, but not limited to, low molecular weight compounds such as triphenyl diamine derivatives, oxadiazole derivatives, polyphilyl derivatives, and stilbene derivatives.

Examples of the hole injection layer 17 include, but not limited to: organic materials such as copper phthalocyanines, starburst amine compounds, polyanilines, and polythiophenes; and metal oxide films. In addition, the hole injection layer 17 is not always required as far as a sufficient ability of hole injection can be obtained without the hole injection layer 17.

Each of the organic compound layers including the light emitting layer 15 can be formed by a vapor-deposition technique and the like. In particular, the light emitting layer 15 can be formed at any position using a mask in the formation.

The anode 18 is prepared using a transparent conductive material such as ITO. In addition, a metal material having a large work function may be formed into a thin film with a thickness of about 1 nm to 10 nm and can be used in a transparent state. Further, both the anode 18 and the cathode 12 may be used such that an interference effect therebetween is used to enhance extraction efficiency and color purity.

The organic light emitting apparatus thus prepared can be provided with a cap (not shown) on the organic light emitting device to prevent it from moisture, oxygen, and the like in the air. To extract light from the film side of the substrate 11, the cap may be made of a transparent material, such as glass. In addition, a gap may be formed between the cap and the organic light emitting device to place a desiccant agent or the like in the gap.

As another method for protecting the organic light emitting device from moisture, oxygen, and the like in the air, a protective film may be formed on the surface of the organic light emitting device. The specific examples of the protective film include: inorganic films, for example, films mainly containing silicon compounds such as silicon nitride, silicon oxide, and silicon oxynitride, and films containing metal oxides; polymer films; and laminated films thereof. Of those, film materials are favorably transparent and capable of blocking moisture and oxygen.

EXAMPLES

Hereinafter, the present invention will be described in further details with reference to examples. However, the present invention is not limited thereto.

First, a drive system in an active-matrix display apparatus and a substrate provided with an active-matrix organic light emitting devices, which are common members for the following respective examples, will be described.

Figure 3:
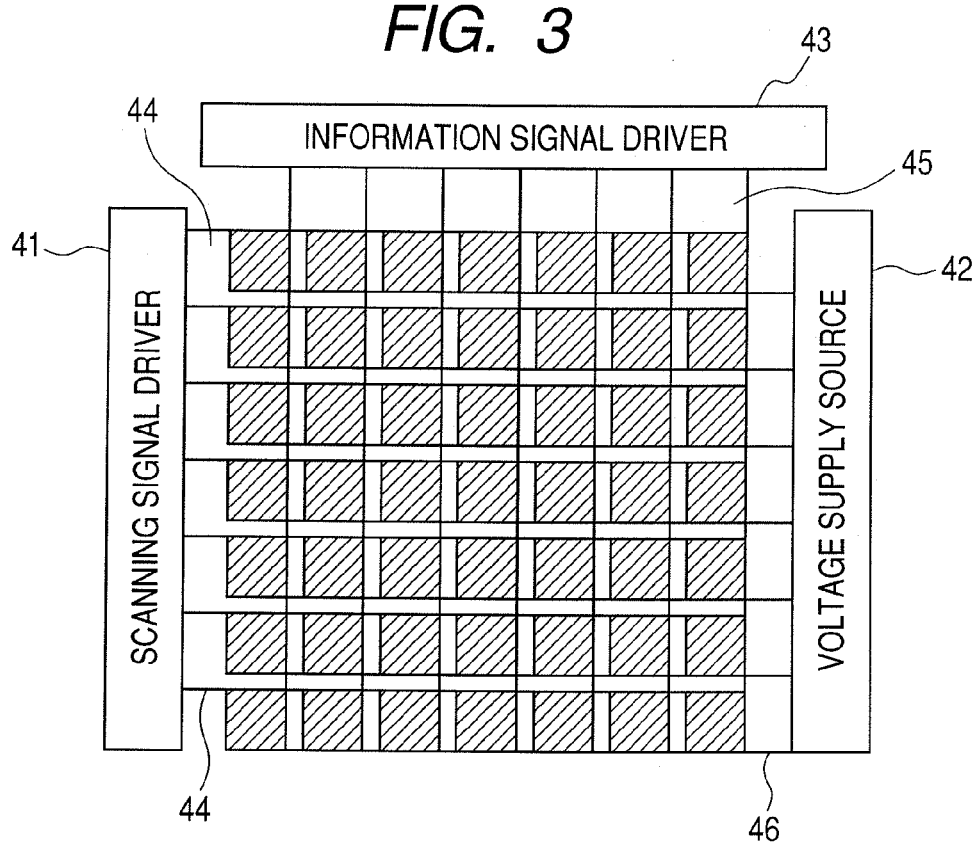
FIG. 3 is a schematic plan diagram that illustrates a configuration of a display apparatus.

Around a panel, as shown in FIG. 3, a drive circuit including a scanning signal driver 41 and a current supply source 42 is disposed. In addition, a display signal input unit, which is an information signal driver 43, is disposed. The scanning signal driver 41, the current supply source 42, and the information signal driver 43 are connected to X-direction scanning lines 44 referred to as gate lines, Y-direction wiring lines 45 referred to as information lines, and current supply line 46, respectively. The scanning signal driver 41 sequentially selects the X-direction scanning lines 44 and image signals are then supplied from the information signal drive 43 in synchronization with the selections. A display pixel is placed at an intersection of the X-direction scanning line 44 and the Y-direction wiring line 45.

Figure 4:
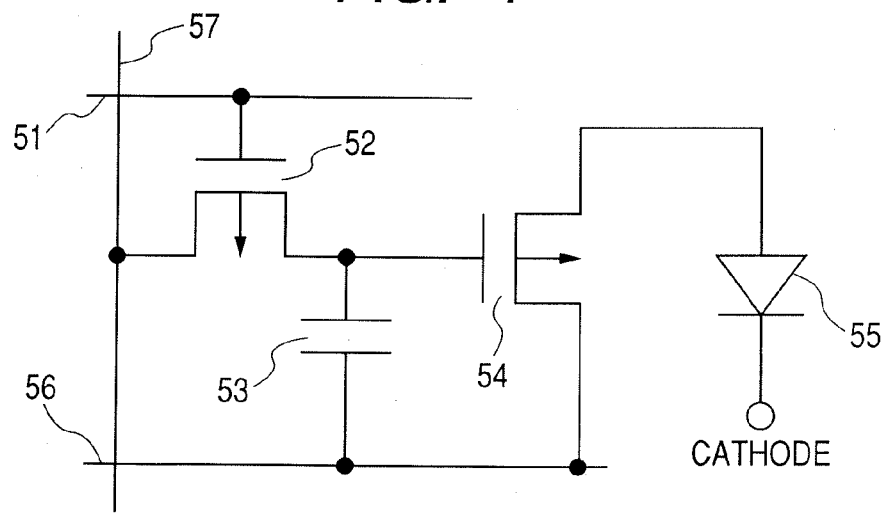
FIG. 4 is an explanatory diagram that illustrates an equivalent circuit.

Next, the drive and operation of a pixel circuit will be described with reference to an equivalent circuit shown in FIG. 4. A $TFT_1$ 52 turns 'ON' when a selection signal is applied on a gate selection line 51. Subsequently, a display signal is supplied from an information signal line 57 to a condenser (Cadd) 53, thereby determining the gate potential of a $TFT_2$ 54. An organic EL device (hereinafter, referred to as an "EL device part") 55 arranged on each pixel is supplied with an electric current from a current supply line 56 depending on the gate potential of the $TFT_2$ 54. The gate potential of the $TFT_2$ 54 is retained in the Cadd 53 during the period of one frame, so the electric current continuously flows from the current supply line 56 to the EL device part 55. Consequently, light emission can be maintained during the period of one frame.

Figure 5:
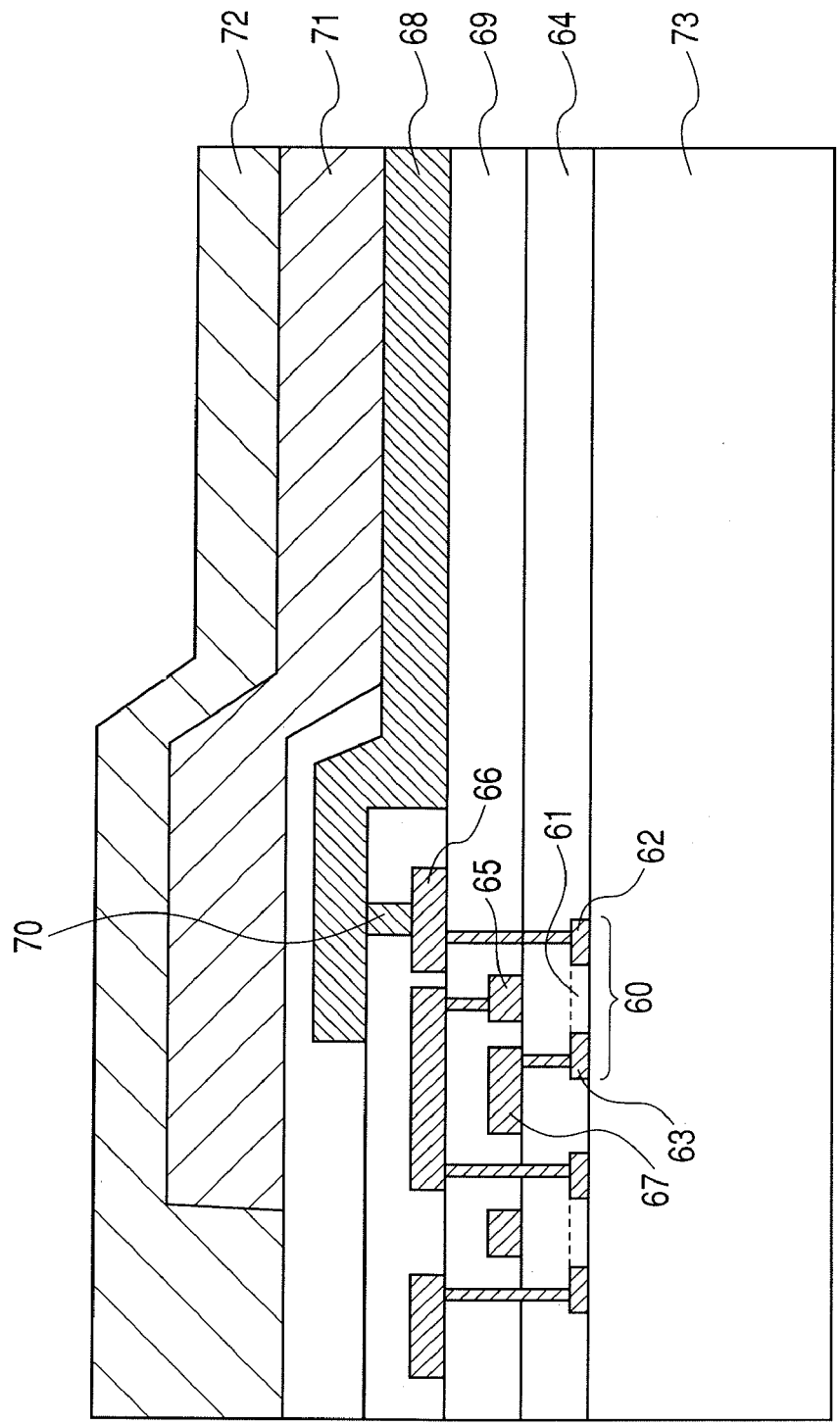
FIG. 5 is a schematic diagram that illustrates a cross-sectional configuration of a thin film transistor (TFT).

Further, a TFT and an organic light emitting device will be described with reference to FIG. 5. A polysilicon p-Si layer 60 is formed on a glass substrate 73 and required impurities are then selected and doped into a channel region 61, a drain region 62, and a source region 63, respectively. A gate electrode 65 is formed on the glass substrate 73 through a gate insulation film 64. In addition, a drain electrode 66 and a source electrode 67 are formed, which are respectively connected to the drain region 62 and the source region 63. In this case, the drain electrode 66 is connected to a pixel electrode 68 through a contact hole 70 formed in an insulation film 69 intervening therebetween.

A multi-layered or mono-layered organic light emitting layer 71 and a common electrode 72 are laminated on the pixel electrode 68 in the stated order, thereby providing an active-matrix organic light emitting device.

In Examples of the present invention, the pixel electrode 68 is used as a cathode and an Al monolayer or a laminate film of Al and ITO are then patterned and used. In addition, for a common electrode 72, ITO was used as an anode.

Example 1

The configuration of an organic light emitting apparatus of Example 1 in accordance with the present invention will be described along with the steps of the manufacturing method.

Figure 6:
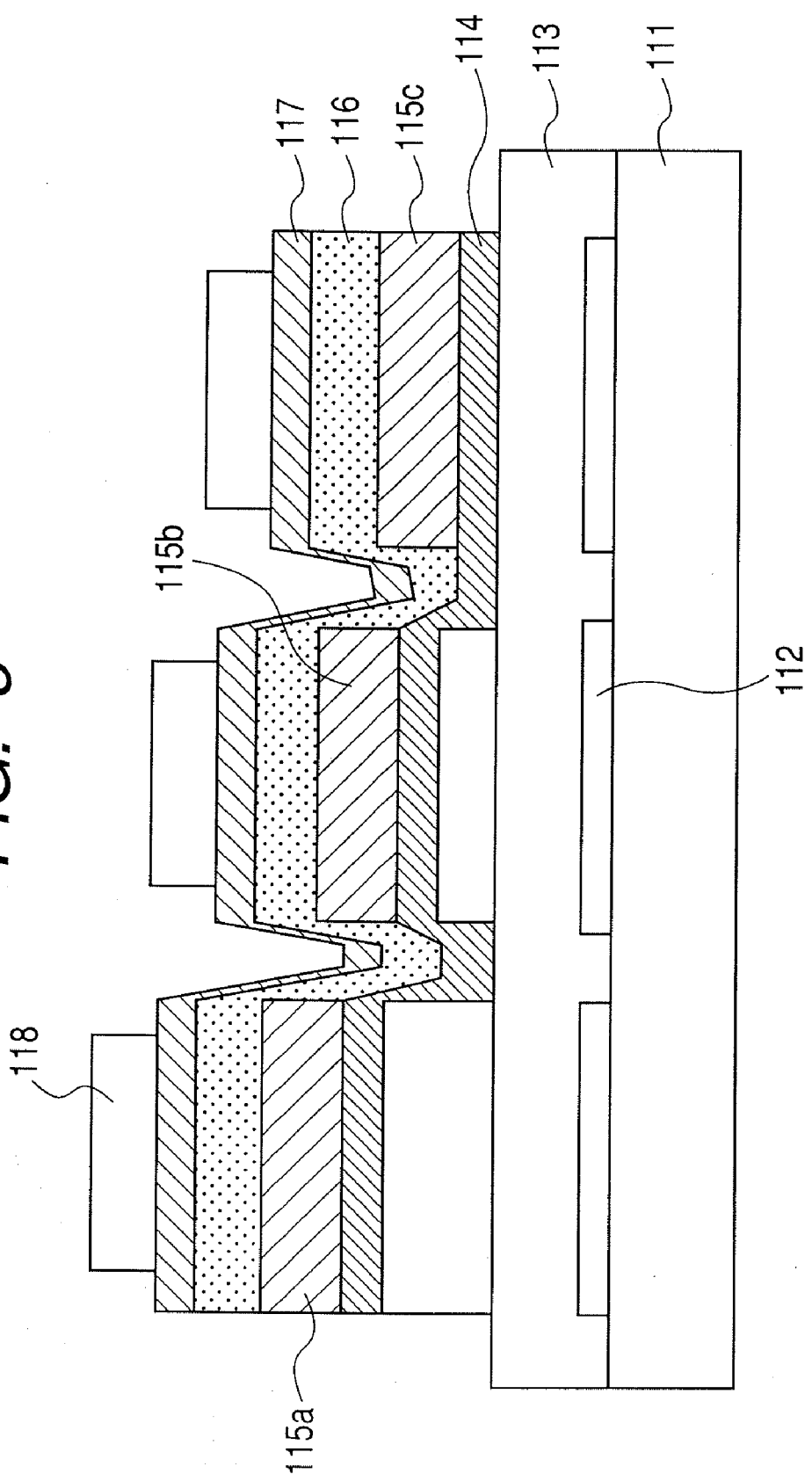
FIG. 6 is a schematic cross-sectional diagram that illustrates a configuration of an organic light emitting apparatus of the present invention.

In this example, an organic light emitting apparatus was manufactured by preparing a substrate (100×100 dots) with an organic light emitting device having the same configuration as one described above as well as a reflective cathode 112. In this case, as the reflective cathode 112, an Al electrode was used. The configuration of an organic light emitting apparatus was schematically illustrated in FIG. 6. In addition, the thickness of each member of the organic light emitting device is shown in Table 1.

TABLE 1

| | Example 1 | | | Comparative example 1 | | |
|---|---|---|---|---|---|---|
| | R | G | B | R | G | B |
| Anode | ITO 80 nm | | | ITO 80 nm | | |
| Hole injection layer (HIL) | 10 nm | | | 10 nm | | |
| Hole transport layer (HTL) | 30 nm | | | 30 nm | | |
| Light emitting layer (EML) | 20 nm | 20 nm | 20 nm | 20 nm | 20 nm | 20 nm |
| Electron transport layer (ETL) | | 10 nm | | 60 nm | 40 nm | 30 nm |
| Electron injection layer (EIL) | 60 nm | 40 nm | 30 nm | | 10 nm | |
| Cathode | Al | | | Al | | |

At first, the film formation of organic compound layers was carried out using a vacuum-deposition technique at a vacuum degree of $10^{-4}$ Pa. The chemical structures of the respective materials used in this example will be described below

HT-1

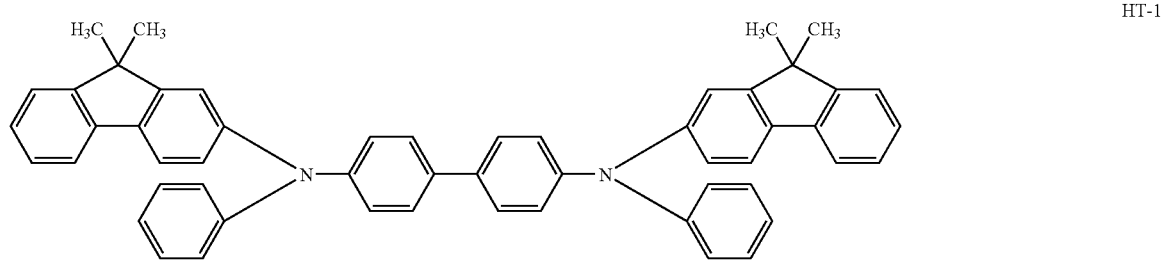

-continued
EM-1
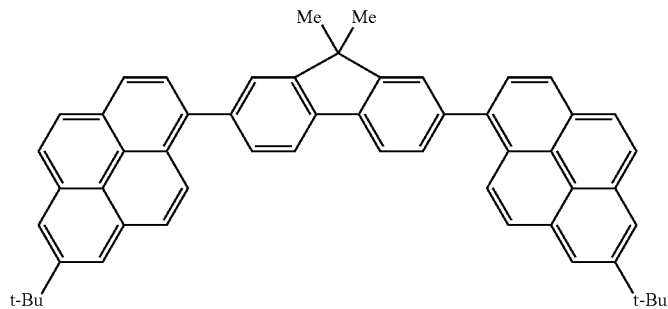
EM-2
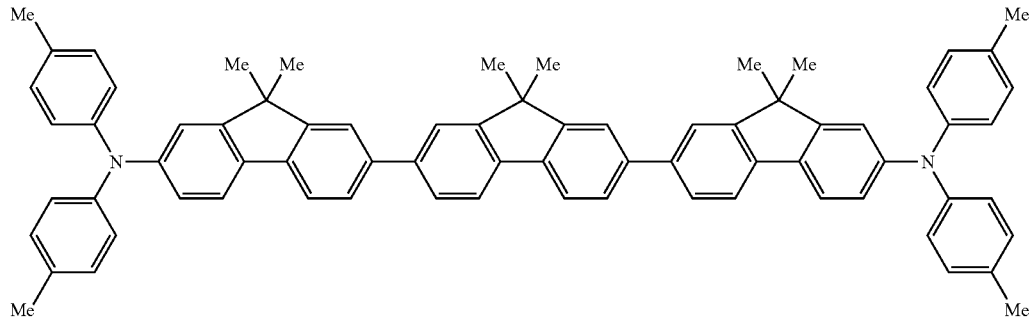
EM-3
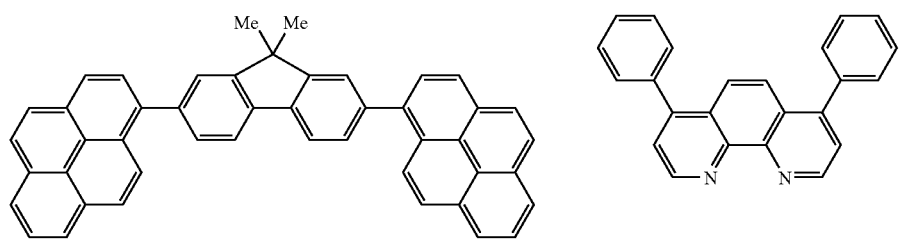
ET-1
EM-4
EM-5
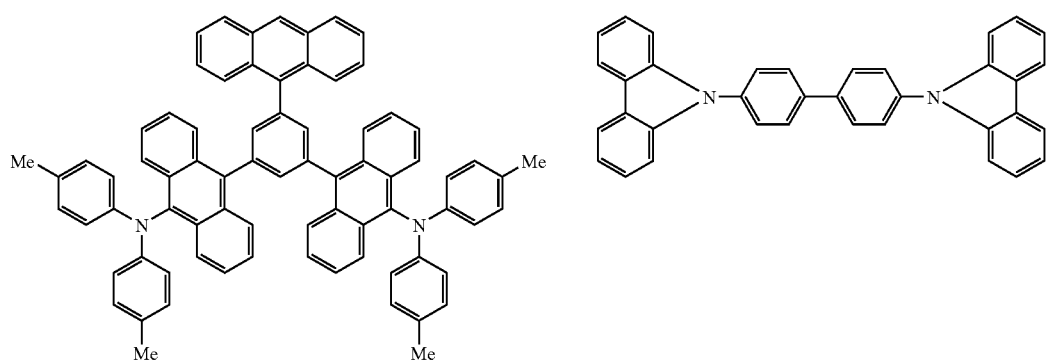
EM-6
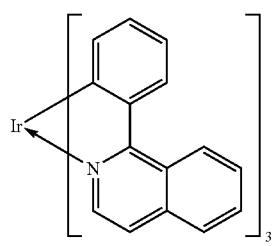

An electron injection layer (ET-1+Cs$_2$CO$_3$) 113 was formed in a thickness of 30 nm, which was common to all pixel regions. The film formation was carried out as follows: The rate was adjusted so that the dope concentration of Cs$_2$CO$_3$ became 0.65 vol % with respect to a deposition rate of 0.3 nm/sec of ET-1 to conduct a co-deposition.

Further, in a manner similar to the above one, a shadow mask was used to form the electron injection layer 113 in a thickness of 30 nm in a pixel region of a device having a red emission and in a thickness of 10 nm in a pixel region of a device having a green emission. Therefore, the thicknesses of the electron injection layers 113 corresponding to the respective colors are 60 nm for red, 40 nm for green, and 30 nm for blue.

After that, the electron transport layer (ET-1) 114 was formed in a thickness of 10 nm with a deposition rate of 0.3 nm/sec with respect commonly to all of pixel regions. Subsequently, a shadow mask was used to form a light emitting layer on the corresponding pixel regions of the device that emits red, green, and blue.

A co-deposition film of EM-5 and EM-6 was formed as a light emitting layer 115a for red light emission such that the co-deposition was carried out with an EM-5 deposition rate of 0.09 nm/sec and an EM-6 deposition rate of 0.01 nm/sec.

A co-deposition film of EM-3 and EM-4 was formed as a light emitting layer 115b for green light emission such that the co-deposition was carried out with an EM-3 deposition rate of 0.09 nm/sec and an EM-4 deposition rate of 0.01 nm/sec.

A co-deposition film of EM-1 and EM-2 was formed as a light emitting layer 115c for blue light emission by adjusting deposition rates such that the co-deposition was carried out with an EM-1 deposition rate of 0.87 nm/sec and an EM-2 deposition rate of 0.13 nm/sec.

In this case, the thicknesses of red, green, and blue light-emitting layers were 20 nm, respectively.

Subsequently, a hole transport layer (HT-1) 116 was formed in a thickness of 30 nm with a deposition rate of 0.3 nm/sec.

Further, a hole injection layer 117 is formed in a thickness of 10 nm by an electron beam (EB) deposition of vanadium oxide (V$_2$O$_5$).

After that, a transparent anode (ITO) 118 was formed in a thickness of 80 nm by a sputtering technique.

Here, the conditions of an optical interference for each color will be considered. The thickness between the reflection cathode 112 and the light emitting layer 115a in the device for red light emission is 70 nm. In addition, the light emitting layer 115a has a thickness of 20 nm. The red light emission material used in this example is a phosphorescence material. The excitation life of the phosphorescence material is 1 μsec, which is long, so it is assumed that the whole light emitting layer 115a shows emission. Therefore, the light emitting region is supposed to be located at the center of the light emitting layer 115a. The reflective index of the organic layer is supposed to be 1.8. Then, the optical path between the reflection cathode 112 and the light emitting region is calculated as (60+10+10)×1.8=144 nm. The device for red light emission has a peak wavelength of about 620 nm, so the primary interference peak is calculated as 620/4=155 nm. However, in consideration of a phase shift or the like at the time of reflection, the thickness can be defined as described above.

Likewise, green and blue will be considered. The devices for green and blue light emission have light emitting layers 115b and 115c with high abilities of electron transport, respectively. Thus, each of them has a light emitting region on the side of the hole transport layer 116. The light emitting region is supposed to be the interface on the side of the hole transport layer 116 of the electron injection layer 113 and the organic layer is supposed to have a refractive index of 1.8. Then, the optical path between the reflection cathode 112 and the light emitting region is calculated for green as (40+10+20)×1.8=126 nm, for blue as (30+10+20)×1.8=108 nm. Both the interference primary peaks of green and blue are calculated for green as 520/4=130 nm and for blue as 450/4=113 nm, which are set so as to almost correspond to the interference conditions, respectively.

The organic light emitting apparatus thus manufactured had light emission efficiencies of 1200 cd/m$^2$, 2400 cd/m$^2$, and 400 cd/m$^2$ for red, green, blue, respectively. Drive voltages when white was displayed were values shown in Table 2. In other words, high efficiencies were observed as follows. The light emission efficiency of the red was about 10.2 cd/A. the light emission efficiency of the green was about 19.7 cd/A, and the light emission efficiency of the blue was about 2.1 cd/A. The organic light emitting apparatus could be driven by a low voltage. That is, drive voltages, when white was displayed while setting the red, green, and blue to 1200 cd/m$^2$, 2400 cd/m$^2$, and 400 cd/m$^2$, were about 4.9 V, about 4.8 V, and about 4.8 V, respectively. In addition, such a organic light emitting apparatus that did not cause an increase in differences between drive voltages for the respective colors of light emission and could be driven with almost constant drive voltages was obtained.

TABLE 2

|  | R | G | B |
|---|---|---|---|
| Example 1 | 10.2 Cd/A | 19.7 Cd/A | 2.1 Cd/A |
|  | 4.9 V | 4.8 V | 4.8 V |
| Comparative example 1 | 10.5 Cd/A | 20.2 Cd/A | 2.3 Cd/A |
|  | 7.3 V | 6.0 V | 5.6 V |

Further, the percentage of pixels with poor light emission was about 0.5%.

Comparative Example 1

An organic light emitting apparatus was manufactured in a manner similar to Example 1, except for the following points: The thickness of an electron injection layer was 10 nm in common for each color. The thicknesses of the electron transport layers for red, green, and blue were set to 60 nm, 40 nm, and 30 nm, respectively. The same optical interference conditions as those of Example 1 were used. In addition, the thickness of each member of the organic light emitting device is shown in Table 1.

The organic light emitting apparatus thus manufactured had light emission efficiencies of 1200 cd/m$^2$, 2400 cd/m$^2$, and 400 cd/m$^2$ for red, green, and blue, respectively. The drive voltages when white was displayed were the values shown in Table 2. In other words, the light emission efficiency of the red was about 10.5 cd/A. The light emission efficiency of the green was about 20.2 cd/A. The light emission efficiency of the blue was about 2.3 cd/A. The efficiencies were slightly improved, compared with Example 1. However, drive voltages when white was displayed while setting the red, green, and blue to 1200 cd/m$^2$, 2400 cd/m$^2$, and 400 cd/m$^2$ were about 7.3 V, about 6.0 V, and about 5.6 V, respectively. Consequently, higher voltages were caused, compared with Example 1. In addition, the differences between the drive voltages for the respective colors of light emission were increased.

Example 2

An example in which the interference peak of each color was under 3λ/4 conditions was illustrated (not shown). In other words, an organic light emitting apparatus was manufactured, except for the following points: A reflection cathode was provided as a laminate structure of Al and 100 nm thick ITO. In addition, the electron injection layers for red, green, and blue had thicknesses of 120 nm, 70 nm, and 40 nm. Further, the thickness of each member included in the organic light emitting device is shown in Table 3.

TABLE 3

|  | Example 2 | | | Comparative example 2 | | |
| --- | --- | --- | --- | --- | --- | --- |
|  | R | G | B | R | G | B |
| Anode | ITO 80 nm | | | ITO 80 nm | | |
| Hole injection layer (HIL) | 10 nm | | | 10 nm | | |
| Hole transport layer (HTL) | 30 nm | | | 30 nm | | |
| Light emitting layer (EML) | 20 nm | 20 nm | 20 nm | 20 nm | 20 nm | 20 nm |
| Electron transport layer (ETL) |  | 10 nm |  | 120 nm | 70 nm | 40 nm |
| Electron injection layer (EIL) | 120 nm | 70 nm | 40 nm |  | 10 nm |  |
| Cathode | ITO 100 nm Al | | | ITO 100 nm Al | | |

The light emitting region in the light emitting layer, the refractive index, and the like are considered in a manner similar to those of Example 1. In addition, the reflective index of ITO on the reflection cathode is supposed to be 2.0. Then, the optical path between the reflection cathode and the light emitting region for red, green, and blue is calculated for red as (120+10+10)×1.8+2.0=412 nm, for green as (70+10+20)× 1.8+100×2.0=380 nm, and for blue as (40+10+20)×1.8+100× 2.0=326 nm. These values are 3λ/4 conditions obtained by calculations, i.e., red: 620×¾=465 nm, green: 520×¾=390 nm, and blue: 450×¾=338 nm, thereby almost corresponding to the calculated values.

The organic light emitting apparatus thus prepared had light emission efficiencies of 1200 cd/m$^2$, 2400 cd/m$^2$, and 400 cd/m$^2$ for red, green, blue, respectively. Drive voltages when white was displayed were values shown in Table 4. In other words, high efficiencies were observed. The light emission efficiency of the red was about 16.2 cd/A. The light emission efficiency of the green was about 19.7 cd/A. The light emission efficiency of the blue was about 2.3 cd/A. The drive voltages when white was displayed were red: 5.0 V, green: 4.9 V, and blue: 4.9 V, respectively. A device showing a high efficiency can be manufactured without an increase in drive voltage by adjusting the optical path with the thickness of the electron injection layer. In addition, an organic light emitting apparatus could be driven by almost the same drive voltage without an increase in drive voltage for each emission color.

TABLE 4

|  | R | G | B |
| --- | --- | --- | --- |
| Example 2 | 16.2 Cd/A | 19.7 Cd/A | 2.3 Cd/A |
|  | 5.0 V | 4.9 V | 4.9 V |
| Comparative example 2 | 12.0 Cd/A | 20.2 Cd/A | 2.7 Cd/A |
|  | 12.3 V | 8.8 V | 5.8 V |

Further, the percentage of pixels with poor light emission was about 0.2% in Example 2, while it was about 0.5% in the organic light emitting apparatus of Example 1. Thus, the number of pixels with poor light emission could be reduced.

Comparative Example 2

A comparative example will be described (not shown). In this case, the optical length adjusted with the electron transport layer was used instead of that adjusted with the electron injection layer. An organic light emitting apparatus was manufactured in a manner similar to Example 2, except for the following points: The thickness of an electron injection layer was 10 nm in common for each color. The thicknesses of the electron transport layers for red, green, and blue were set to 120 nm, 70 nm, and 40 nm. The same optical interference conditions as those of Example 2 were used. In addition, the thickness of each member of the organic light emitting device is shown in Table 3.

The organic light emitting apparatus thus manufactured had light emission efficiencies of 1200 cd/m$^2$, 2400 cd/m$^2$, and 400 cd/m$^2$ for red, green, and blue, respectively. The drive voltages when white was displayed were the values shown in Table 4. In other words, the light emission efficiency of the red was about 12.0 cd/A. The light emission efficiency of the green was about 20.2 cd/A. The light emission efficiency of the blue was about 2.7 cd/A. The efficiencies were slightly improved, compared with Example 2. However, the drive voltages when white was displayed while setting the red, green, and blue to 1200 c/m$^2$, 2400 cd/m$^2$, and 400 cd/m$^2$ were about 12.3 V, about 8.8 V, and about 5.8 V, respectively. Consequently, higher voltages were caused, compared with Example 2. In addition, the differences between the drive voltages for the respective colors of light emission were increased.

The organic light emitting apparatus of the present invention can be applied as a display apparatus. For example, it can be applied as a screen or a finder screen of a digital camera, a screen of a portable telephone, an operation screen of a printer such as a copying machine, a PC or TV display, a car-mounted panel, a display part of a personal digital assistance (PDA), a display part of a portable audio machine, or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-304791, filed Nov. 10, 2006, and No. 2007-272013, filed Oct. 19, 2007, which are hereby incorporated by reference herein in their entirety.

What is claimed is:

1. An organic light emitting apparatus, comprising:
   a substrate; and a plurality of organic light emitting devices having different emission colors to each other formed on the substrate, each of the plurality of organic light emitting devices including an optically-reflective cathode, an electron injection layer which is in contact with the cathode, organic compound layers including a light emitting layer, and an optically-transparent anode, the electron injection layer including an organic compound and at least one of an alkali metal, an alkaline earth metal, an alkali metal compound, and an alkaline earth metal compound, wherein the organic compound layers except the light emitting layer in each of the organic light emitting devices have the same thickness without depending on the different emission colors, a thickness of the electron injection layer in each of the organic light emitting devices is different from each other, and an optical distance between a light emission position in the light emitting layer and a reflection surface of the cathode in each of the plurality of organic light emitting devices is an uneven multiple of $\lambda/4$ with respect to a peak wavelength of $\lambda$, light emitted from the light emitting layer.

2. An organic light emitting apparatus according to claim 1, wherein the organic compound layers include a charge transport layer, and the charge transport layer is commonly formed to cross over the plurality of organic light emitting devices having the different emission colors.

3. An organic light emitting apparatus according to claim 1, wherein the optical distance between the light emission position in the light emitting layer and the reflection surface of the cathode in each of the plurality of organic light emitting devices is $3/4$ of the peak wavelength of light emitted from the light emitting layer.

4. An organic light emitting apparatus according to claim 1, wherein the alkali metal compound is a cesium compound.

5. An organic light emitting apparatus according to claim 4, wherein the cesium compound is a substance obtained by heating cesium carbonate.

6. An organic light emitting apparatus according to claim 1, wherein the substrate has a plurality of thin film transistors formed thereon for driving the plurality of organic light emitting devices.

7. An organic light emitting apparatus according to claim 6, wherein the plurality of thin film transistors is of a n-channel type.

8. An organic light emitting apparatus according to claim 7, wherein a semiconductor layer that forms the plurality of thin film transistors is an amorphous silicon.

9. An organic light emitting apparatus, comprising:

a substrate; and a plurality of organic light emitting devices having different emission colors to each other formed on the substrate, each of the plurality of organic light emitting devices including an optically-reflective cathode, an electron injection layer which is in contact with the cathode, organic compound layers including a light emitting layer, and an optically-transparent anode, the electron injection layer including an organic compound and at least one of an alkali metal, an alkaline earth metal, an alkali metal compound, and an alkaline earth metal compound, wherein the organic compound layers except the light emitting layer in each of the organic light emitting devices have the same thickness without depending on the different emission colors, a thickness of the electron injection layer in each of the organic light emitting devices is different from each other, and an optical distance between a light emission position in the light emitting layer and a reflection surface of the cathode in each of the plurality of organic light emitting devices is such that light emitted from the light emission position and light that is reflected from the optically-reflective cathode interferes with each other and is reinforced.

* * * * *